United States Patent
Kobune et al.

(10) Patent No.: US 12,441,576 B2
(45) Date of Patent: Oct. 14, 2025

(54) THERMAL CONDUCTION SHEET HOLDER AND METHOD OF MANUFACTURING HEAT DISSIPATING DEVICE

(71) Applicant: RESONAC CORPORATION, Tokyo (JP)

(72) Inventors: Mika Kobune, Tokyo (JP); Michiaki Yajima, Tokyo (JP); Keita Suga, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 1 day.

(21) Appl. No.: 18/031,623

(22) PCT Filed: Oct. 14, 2021

(86) PCT No.: PCT/JP2021/038132
§ 371 (c)(1),
(2) Date: Apr. 13, 2023

(87) PCT Pub. No.: WO2022/080471
PCT Pub. Date: Apr. 21, 2022

(65) Prior Publication Data
US 2024/0017955 A1  Jan. 18, 2024

(30) Foreign Application Priority Data
Oct. 16, 2020  (WO) .............. PCT/JP2020/039140

(51) Int. Cl.
*H01L 23/373* (2006.01)
*B23P 15/26* (2006.01)
(Continued)

(52) U.S. Cl.
CPC ............ *B65H 37/002* (2013.01); *B23P 15/26* (2013.01); *H01L 24/27* (2013.01); *H01L 24/29* (2013.01);
(Continued)

(58) Field of Classification Search
CPC .... B32B 3/16; B32B 3/18; B32B 3/22; B32B 3/266; B32B 7/027; B32B 7/06;
(Continued)

(56) References Cited

U.S. PATENT DOCUMENTS

2014/0022731 A1 * 1/2014 Chen .............. H05K 13/00
428/41.8

FOREIGN PATENT DOCUMENTS

CN  104505347 A  *  4/2015
EP  3805129 A1    4/2021
(Continued)

*Primary Examiner* — Michael A Tolin
(74) *Attorney, Agent, or Firm* — SOLARIS Intellectual Property Group, PLLC

(57) ABSTRACT

A thermal conduction sheet holder include, in the following order, an elongated carrier film, a plurality of thermal conduction sheets, and an elongated cover film covering the plurality of thermal conduction sheets, the shortest distance between adjacent thermal conduction sheets is 2 mm or more, the plurality of thermal conduction sheets are disposed at intervals in a longitudinal direction of the carrier film and the cover film, and the plurality of thermal conduction sheets are peelable from the cover film and the carrier film.

9 Claims, 3 Drawing Sheets

(51) Int. Cl.
*B32B 7/06* (2019.01)
*B65H 37/00* (2006.01)
*H01L 23/00* (2006.01)

(52) U.S. Cl.
CPC ............ *H01L 24/32* (2013.01); *H01L 24/74* (2013.01); *H01L 24/83* (2013.01); *H01L 23/3733* (2013.01); *H01L 2224/27436* (2013.01); *H01L 2224/2929* (2013.01); *H01L 2224/29291* (2013.01); *H01L 2224/29324* (2013.01); *H01L 2224/29339* (2013.01); *H01L 2224/29347* (2013.01); *H01L 2224/29386* (2013.01); *H01L 2224/29393* (2013.01); *H01L 2224/29499* (2013.01); *H01L 2224/32245* (2013.01); *H01L 2224/743* (2013.01); *H01L 2224/83191* (2013.01); *H01L 2224/83192* (2013.01); *H01L 2224/83201* (2013.01); *H01L 2924/01006* (2013.01); *H01L 2924/0503* (2013.01); *H01L 2924/05032* (2013.01); *H01L 2924/0532* (2013.01); *H01L 2924/05432* (2013.01); *H01L 2924/0615* (2013.01); *H01L 2924/0635* (2013.01)

(58) Field of Classification Search
CPC ......... B32B 27/08; B32B 27/10; B32B 27/20; B32B 27/36; B32B 37/025; B32B 2037/268; B32B 2264/10; B32B 2264/102; B32B 2264/1023; B32B 2264/105; B32B 2264/1051; B32B 2264/1052; B32B 2264/1055; B32B 2264/107; B32B 2264/108; B32B 2264/201; B32B 2307/302; B32B 2307/7376; B32B 2307/748; B32B 2405/00; B32B 2457/00; B65H 37/002; H01L 21/4882; H01L 23/373; H01L 23/3733; H01L 23/3735; H01L 23/3737; H01L 24/26; H01L 24/27; H01L 24/28; H01L 24/29; H01L 24/31; H01L 24/32; H01L 24/74; H01L 24/83; H01L 2224/27436; H01L 2224/2929; H01L 2224/29291; H01L 2224/29324; H01L 2224/29339; H01L 2224/29347; H01L 2224/29386; H01L 2224/29387; H01L 2224/29393; H01L 2224/743; H01L 2224/83; H01L 2224/831; H01L 2224/83191; H01L 2224/83192; H01L 2224/83201; H01L 2224/83203; H05K 7/20472; H05K 7/20481

See application file for complete search history.

(56) References Cited

FOREIGN PATENT DOCUMENTS

| | | | |
|---|---|---|---|
| JP | H107-149365 A | | 6/1995 |
| JP | 2001-250894 A | | 9/2001 |
| JP | 2002-026202 A | | 1/2002 |
| JP | 2002222904 A | * | 8/2002 |
| JP | 2008-098493 A | | 4/2008 |
| JP | 2008-280496 A | | 11/2008 |
| JP | 2009-117656 A | | 5/2009 |
| JP | 2010-073789 A | | 4/2010 |
| JP | 2013-145835 A | | 7/2013 |
| JP | 2013-239525 A | | 11/2013 |
| JP | 2015-201573 A | | 11/2015 |
| JP | 2019-204933 A | | 11/2019 |
| JP | 2020-025006 A | | 2/2020 |
| KR | 10-1717021 B1 | | 3/2017 |
| TW | I688018 B | * | 3/2020 |
| WO | 2018/110255 A1 | | 6/2018 |

* cited by examiner

THERMAL CONDUCTION SHEET HOLDER AND METHOD OF MANUFACTURING HEAT DISSIPATING DEVICE

TECHNICAL FIELD

The present invention relates to a thermal conduction sheet holder and a method of manufacturing a heat dissipating device.

BACKGROUND ART

In recent years, the amount of heat generation has increased due to the increased mounting density of wiring and electronic components in semiconductor packages using multilayer wiring boards, and the amount of heat generation per unit area has increased due to the high integration of semiconductor elements, and improved heat dissipation has been desired for semiconductor packages.

A heat dissipating device that dissipates heat by sandwiching and adhering thermally conductive grease or a thermal conduction sheet between a heat generator such as a semiconductor package and a heat dissipator such as aluminum or copper is commonly used. Generally, a thermal conduction sheet is superior to heat conductive grease in workability when assembling a heat dissipating device.

As a thermal conduction sheet, a resin sheet filled with a thermally conductive filler is known. As a resin sheet filled with thermally conductive filler and having excellent thermal conductivity, various resin sheets have been proposed in which inorganic particles with high thermal conductivity are selected as the thermally conductive filler and the inorganic particles are oriented perpendicular to the sheet surface.

For example, a thermal conduction sheet in which thermal conductive filler (boron nitride) is oriented almost perpendicular to the sheet surface (see, for example, Patent Document 1), and a thermal conduction sheet in which carbon fibers dispersed in a gel-like substance have an oriented structure perpendicular to the sheet surface, have been proposed (see, for example, Patent Document 2).

CITATION LIST

Patent Documents

[Patent Document 1] Japanese Patent Application Laid-Open (JP-A) No. 2002-26202
[Patent Document 1] JP-A No. 2001-250894

SUMMARY OF INVENTION

Technical Problem

A heat dissipating device can be manufactured by sandwiching and adhering the thermal conduction sheet described in Patent Documents 1 and 2 between a heat generator such as a semiconductor package and a heat dissipator such as aluminum or copper. Since the demand for heat dissipating devices is increasing, a method capable of efficiently manufacturing a heat dissipating device, a thermal conduction sheet used in such a method, and the like have been required.

The present disclosure has been made in view of the above, and the object is to provide a thermal conduction sheet holder capable of efficiently manufacturing the thermal conduction sheet holder, and a method of manufacturing a heat dissipating device using this thermal conduction sheet holder.

Solution to Problem

The specific means to solve the above problems include the following aspects.
<1> A thermal conduction sheet holder, comprising, in the following order: an elongated carrier film; a plurality of thermal conduction sheets; and an elongated cover film covering the plurality of thermal conduction sheets, wherein: the plurality of thermal conduction sheets are disposed at intervals in a longitudinal direction of the carrier film and the cover film, and the plurality of thermal conduction sheets are peelable from the cover film and the carrier film.
<2> The thermal conduction sheet holder according to <1>, further comprising a release layer between the carrier film and the plurality of thermal conduction sheets, wherein the plurality of thermal conduction sheets are peelable from the carrier film via the release layer.
<3> The thermal conduction sheet holder according to <2>, comprising a plurality of the release layers disposed along a longitudinal direction of the carrier film, wherein one or more of the thermal conduction sheets are disposed on each of the plurality of release layers.
<4> The thermal conduction sheet holder according to <3>, wherein, when the cover film is disposed at a lower side in a vertical direction and the carrier film is disposed at an upper side in the vertical direction, a shape of a gap formed by the adjacent release layers, and the adjacent thermal conduction sheets respectively disposed on the adjacent release layers, is convex when viewed from a width direction of the thermal conduction sheet holder.
<5> The thermal conduction sheet holder according to any one of <1> to <4>, wherein a peel force between the carrier film and the thermal conduction sheet is larger than a peel force between the cover film and the thermal conduction sheet.
<6> The thermal conduction sheet holder according to any one of <1> to <5>, wherein an average thickness of the thermal conduction sheet is from 50 μm to 500 μm.
<7> The thermal conduction sheet holder according to any one of <1> to <6>, wherein the thermal conduction sheet contains a thermal conductive filler and a resin.
<8> The thermal conduction sheet holder according to any one of <1> to <7>, which is configured to be taken up along a longitudinal direction of the thermal conduction sheet holder in a roll shape.
<9> The thermal conduction sheet holder according to any one of <1> to <8>, wherein a width of the carrier film and a width of the cover film are larger than a width of the thermal conduction sheet in a width direction perpendicular to a longitudinal direction of the carrier film and the cover film.
<10> The thermal conduction sheet holder according to any one of <1> to <9>, wherein a shortest distance between adjacent thermal conduction sheets is 2 mm or more,
<11> The thermal conduction sheet holder according to any one of <1> to <10>, wherein a notch is not generated on a surface of the carrier film.
<12> A method of manufacturing a heat dissipating device obtained by using the thermal conduction sheet holder according to any one of <1> to <11>, and interposing the thermal conduction sheet between a heat generator and a heat dissipator, the method comprising:
- a step of peeling the cover film from the thermal conduction sheet holder;
- a step of pressure bonding the thermal conduction sheet to one of the heat generator or the heat dissipator in the thermal conduction sheet holder from which the cover film is peeled;
- a step of peeling the carrier film from the thermal conduction sheet to which the one of the heat generator or the heat dissipator is adhered; and
- a step of pressure bonding the other of the heat generator or the heat dissipator to an opposite side of the thermal conduction sheet from the side at which the one of the heat generator or the heat dissipator is bonded.

Advantageous Effects of Invention

According to the present disclosure, a thermal conduction sheet holder capable of efficiently manufacturing the thermal conduction sheet holder, and a method of manufacturing a heat dissipating device using this thermal conduction sheet holder can be provided.

DESCRIPTION OF EMBODIMENTS

Figure 1:
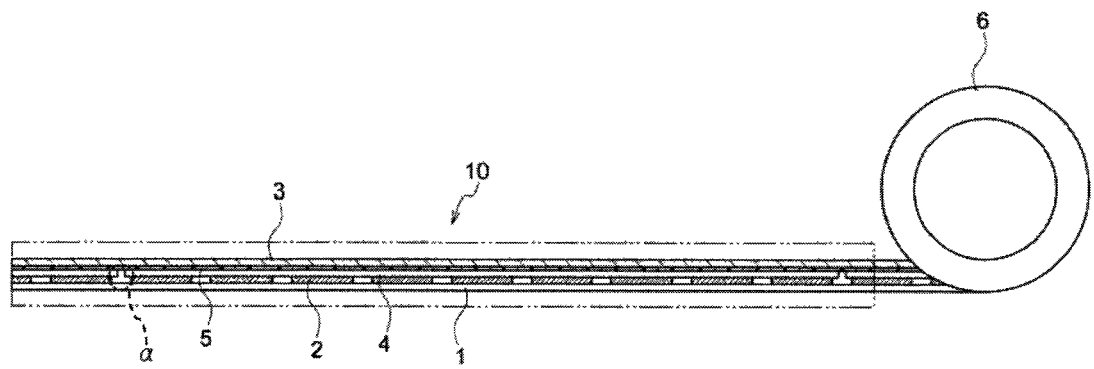
FIG. 1 is a side view of an example of a thermal conduction sheet holder of the present disclosure.

Embodiments for carrying out the invention will be described below in detail. However, the invention is not limited to the following embodiments. In the following embodiments, components (including elemental steps, etc.) thereof are not essential unless otherwise specified. The same applies to numerical values and ranges, which do not limit the invention.

In the present disclosure, the term "step" encompasses an independent step separated from other step(s) as well as a step that is not clearly separated from other step(s), as long as a purpose of the step can be achieved.

In the present disclosure, a numerical range described using "to" indicates a range including the numerical values before and after "to" as a minimum value and a maximum value, respectively.

In numerical ranges described herein in a stepwise manner, an upper limit value or a lower limit value described in one numerical range may be replaced with an upper limit value or a lower limit value of another numerical range described in a stepwise manner. In addition, in a numerical range described herein, the upper limit value or the lower limit value of the numerical range may be replaced with a value described in the Examples section.

In the present disclosure, in a case in which there are plural types of substances corresponding to a component in a composition, a content of the component means the total content of the plural types of substances present in the composition, unless otherwise specified.

In the present disclosure, particles corresponding to a component may include plural types of particles. In a case in which there are the plural types of particles corresponding to a component in a composition, a particle size of the component means a value for a mixture of the plural types of particles present in the composition, unless otherwise specified.

In the present disclosure, the term "layer" encompasses a case in which, when a region having the layer is observed, the layer is formed on the entire region, as well as a case in which the layer is formed on only a part of the region.

In the present disclosure, the term "laminate" indicates stacking layers, in which case two or more layers may be bonded with each other or may be detachable from one another.

In the present disclosure, a thickness of a layer is a value obtained by measuring a thickness of the target layer at 5 points and arithmetically averaging those values.

The thickness of the layer can be measured using a micrometer or the like. In the present disclosure, in a case in which the thickness of the layer can be measured directly, it is measured using a micrometer. On the other hand, in a case in which the thickness of one layer or the total thickness of a plurality of layers is measured, the thickness may be measured by observing the cross section of the object to be measured using an electron microscope.

When embodiments are described in the present disclosure with reference to drawings, the configurations of the embodiments are not limited to the configurations shown in the drawings. In addition, the sizes of the members in each drawing are conceptual, and the relative relationship between the sizes of the members is not limited to this.

<Thermal Conduction Sheet Holder>

A thermal conduction sheet holder of the present disclosure includes, in the following order, an elongated carrier film, a plurality of thermal conduction sheets, and an elongated cover film covering the plurality of thermal conduction sheets, and the plurality of thermal conduction sheets are disposed at intervals in a longitudinal direction of the carrier film and the cover film, and the plurality of thermal conduction sheets are peelable from the cover film and the carrier film.

In the thermal conduction sheet holder of the present disclosure, the plurality of thermal conduction sheets are disposed on the elongated carrier film, and the plurality of thermal conduction sheets can be transported along with the carrier film. Thereby, while transporting the plurality of thermal conduction sheets with the cover film peeled from the thermal conduction sheet holder along with the carrier film, the thermal conduction sheets are able to be continuously mounted on the heat generator, the heat dissipator, or the like by attaching each of them to the heat generator, the heat dissipator, or the like. From the above, it is possible to manufacture a heat dissipating device efficiency.

The thermal conduction sheet holder of the present disclosure preferably has a configuration that is taken up along a longitudinal direction of the thermal conduction sheet holder. At this time, the thermal conduction sheet holder may be wound around a winding core. By pulling out the thermal conduction sheet holder configured to be taken up in a roll shape and peeling the cover film from the thermal conduction sheet, the thermal conduction sheets can be continuously mounted on the heat generator, heat dissipator, or the like in a continuous roll-to-roll process. From the above, it is possible to manufacture a heat dissipating device more efficiency.

(Carrier Film)

The thermal conduction sheet holder of the present disclosure includes an elongated carrier film. The carrier film is an elongated film member for transporting the thermal conduction sheets, and the plurality of thermal conduction sheets are disposed on the carrier film at intervals along the longitudinal direction either directly or via a release layer which will be described later, or the like. The carrier film is peelable from the thermal conduction sheets.

The material of the carrier film is not particularly limited as long as the plurality of thermal conduction sheets disposed on the carrier film either directly or via a release layer can be transported, and examples thereof include resins such as polyethylene, polyester, polypropylene, polyethylene terephthalate, polyimide, polyetherimide, polyether naphthalate, and methylpentene.

The carrier film may be a single-layer film including at least one kind of the aforementioned resins, or may be a multi-layer film in which two or more layers including at least one of the aforementioned resins are stacked.

From the viewpoint of easily peeling the carrier film from the thermal conduction sheets, a release layer between the carrier film and the plurality of thermal conduction sheets may be disposed, the carrier film may be peelable from the plurality of thermal conduction sheets via the release layer. The release layer may be, for example, a release film surface-treated with a silicone-based or silica-based release agent. The material of the release film surface-treated with the release agent is the same as the material of the carrier film described above. The release layer such as the release film may be disposed on the carrier film via an adhesive layer, or the thermal conduction sheet holder of the present disclosure has a configuration that the carrier film, the adhesive layer, the release layer, and the thermal conduction sheets may be layered in the above order when viewed from a side of the carrier film.

The average thickness of the carrier film is not particularly limited, and, it can be selected as appropriate in consideration of the strength of the carrier film, the transportability of the thermal conduction sheet or the like. Specifically, the average thickness of the carrier film is preferably from 25 µm to 200 µm, more preferably from 50 µm to 150 µm, and still more preferably from 50 µm to 100 µm.

In a case in which a release layer is disposed between the carrier film and the plurality of thermal conduction sheets, the average thickness of the release layer is not particularly limited, and is preferably from 0.01 µm to 30 µm, and more preferably from 1 µm to 10 µm from the viewpoint of releasability of the thermal conduction sheets and miniaturization of the thermal conduction sheet holder.

In a case in which the release layer is a release film on which a release agent is surface-treated, the average thickness of the release film is not particularly limited, and is preferably from 2 µm to 200 µm, more preferably from 25 µm to 200 µm, still more preferable from 50 µm to 150 µm, and particularly preferably from 50 µm to 100 µm from the viewpoint of ensuring adhesive properties and miniaturization of the thermal conduction sheet holder.

In a case in which an adhesive layer is disposed between the release layer and the carrier film, examples of adhesives used in the adhesive layer include commonly used acrylic adhesives, natural rubber adhesives, synthetic rubber adhesives, silicone adhesives, and mixed adhesives thereof. The adhesive layer may contain a component other than the adhesive, and may contain a cross-linking agent, a tackifier, or the like.

The average thickness of the adhesive layer is not particularly limited, and is preferably from 2 µm to 200 µm, more preferably from 5 µm to 100 µm, and still more preferable from 10 µm to 50 µm from the viewpoint of ensuring adhesive properties and miniaturization of the thermal conduction sheet holder.

(Cover Film)

The thermal conduction sheet holder of the present disclosure include an elongated carrier film. The cover film is an elongated member for covering and protecting the plurality of thermal conduction sheets. The cover film is peelable from the thermal conduction sheets.

The cover film is not particularly limited and examples thereof include films made of the aforementioned resin that can be included in the carrier film, paper films such as woodfree paper, coated paper, craft paper, glassine paper, and recycled paper, and metal foil such as aluminum. Among them, from the viewpoint of easily peeling the cover film from the thermal conduction sheets, the paper film are preferable.

The cover film may be a single-layer film consisting of any one of the aforementioned film, metal foil and the like, or may be a multi-layer film in which two or more layers of the aforementioned film, metal foil and the like are stacked.

A release layer may be disposed on a surface of the cover film in a side of the plurality of thermal conduction sheets, and the cover film may be peelable from the plurality of thermal conduction sheets via the release layer. The release layer may be, for example, a layer containing a silicone-based or silica-based release agent. In a case in which the cover film is a paper film, from the viewpoint of preventing the penetration of the release agent into the paper film, a layer containing polyethylene or the like that functions as a filler, may be disposed on a layer containing the release layer and the paper film.

The average thickness of the cover film is not particularly limited, and is preferably from 25 µm to 200 µm, more preferably from 50 µm to 150 µm, and still more preferably from 75 µm to 150 µm from the viewpoint of the strength of the cover film and miniaturization of the thermal conduction sheet holder. Herein, in a case in which the release layer, or a layer containing polyethylene or the like as necessary, is disposed on a surface of the cover film in a side of the plurality of thermal conduction sheets, the average thickness of the cover film means the total of the average thickness including the release layer and the like.

In the thermal conduction sheet holder of the present disclosure, it is preferable that a notch is not generated on a surface of the cover film, carrier film or release film, preferably the surface thereof of a side of the thermal conduction sheet, it is more preferable that a notch derived from cutting by dicing processing, laser processing, or the like is not generated. In particular, it is preferable that a notch is not generated of the surface of the cover film or carrier film, and it is more preferable that a notch is not generated on the surface of the carrier film. In a case in which a notch is not generated on these films, it is possible to prevent breakage or deformation of these films when tensile stress or the like is applied to the thermal conduction sheet holder. As a result, it is prevented that the thermal conduction sheets cannot be continuously pressure bonded to an adherend using the thermal conduction sheet holder or, in the thermal conduction sheet holder, the relative positions between the plurality of thermal conduction sheets are misaligned and the thermal conduction sheets cannot be pressure bonded to the adherend with high accuracy. In particular, since a notch is not generated on the carrier film, even when the thermal conduction sheet is pressure bonded to the adherend in a continuous process by the method shown FIG. 3, which will be described later, breakage of the carrier film, misalignment of the thermal conduction sheet on the carrier film, or the like due to tensile stress or the like is suitably prevented.

In the thermal conduction sheet holder of the present disclosure, it is preferable that the peel force between the carrier film and the thermal conduction sheet is larger than the peel force between the cover film and the thermal conduction sheet. Thereby, when the cover film is peeled from the thermal conduction sheet holder, it is possible to prevent the occurrence of peeling between the carrier film and the thermal conduction sheet and the adhesion of the thermal conduction sheet to the peeled cover film.

The peel force between the carrier film and the thermal conduction sheet and the peel force between the cover film and the thermal conduction sheet may be adjusted, for example, by disposing the release layer between the carrier film and the plurality of thermal conduction sheets, disposing the release layer on a surface of the cover film in a side of the plurality of thermal conduction sheets, or changing the kind of the release agent contained in the release layer.

In a case in which the release layer is disposed between the carrier film and the plurality of thermal conduction sheets, it is preferable that the peel force between the release layer and the thermal conduction sheet is larger than the peel force between the cover film and the thermal conduction sheet.

The peel force between the cover film and the thermal conduction sheet is preferably from 0 mN/25 mm to 30 mN/25 mm, more preferably from 0 mN/25 mm to 10 mN/25 mm, and still more preferably from 0 mN/25 mm to 5 mN/25 mm. Herein, the peel force of 0 mN/25 mm indicates that when the cover film is attached to a tensile tester so as to be pulled in a direction of 90° with respect to the interface with the thermal conduction sheet, they are already peeled.

The peel force between the cover film and the thermal conduction sheet in the present disclosure is the maximum value of the peel strength when preparing a layered film with the width of 25 mm, and pulling the cover film in a direction of 90° with respect to the interface with the thermal conduction sheet under the conditions of a tensile speed of 100 mm/min and a temperature of 23° C. by using a tensile tester to peel the cover film from the thermal conduction sheet.

The peel force between the carrier film and the thermal conduction sheet, and preferably the peel force between the release layer, which is disposed between the carrier film and the thermal conduction sheet, and the thermal conduction sheet is preferably from 5 mN/25 mm to 50 mN/25 mm, more preferably from 10 mN/25 mm to 30 mN/25 mm, and still more preferably from 12 mN/25 mm to 30 mN/25 mm.

The peel force between the carrier film or the release layer and the thermal conduction sheet in the present disclosure is the maximum value of the peel strength when preparing a layered film with the width of 25 mm, and pulling the cover film or the release layer in a direction of 90° with respect to the interface with the thermal conduction sheet under the conditions of a tensile speed of 100 mm/min and a temperature of 23° C. by using a tensile tester to peel the cover film or the release layer from the thermal conduction sheet.

It is preferable that the peel force between the carrier film and the thermal conduction sheet (preferably the peel force between the release layer, which is disposed between the carrier film and the thermal conduction sheet, and the thermal conduction sheet) is larger than the peel force between the cover film and the thermal conduction sheet, and these difference is preferably from 5 mN/25 mm to 30 mN/25 mm, more preferably from 10 mN/25 mm to 25 mN/25 mm, and still more preferably from 15 mN/25 mm to 20 mN/25 mm.

A sheet-like object such as the thermal conduction sheet may have an adhesive component on a surface in a side of facing the cover film from the viewpoint of adhesion to an adherend. In the sheet-like object holder, the sheet-like object is held in a state in which the cover film does not come into contact with the sheet-like object, and therefore adhesion of the sheet-like object to the cover film due to the adhesive component is prevented.

(Thermal Conduction Sheet)

The thermal conduction sheet holder of the present disclosure includes a plurality of thermal conduction sheets between the elongated carrier film and the elongated cover film, and the plurality of thermal conduction sheets are disposed at intervals in a longitudinal direction of the carrier film and the cover film.

The average thickness of the thermal conduction sheet is not particularly limited and can be appropriately selected depending on the purpose. Specifically, the average thickness of the thermal conduction sheet can be from 50 μm to 500 μm, from the point of the thermal conductivity and adhesiveness, is preferably from 60 μm to 300 μm, and more preferably from 70 μm to 200 μm.

The shape of a main surface of the thermal conduction sheet is not particularly limited and may be appropriately changed depending on the shapes of the heat generator and heat dissipator to which the thermal conduction sheet is adhered. The shape of the main surface of the thermal conduction sheet may be circular, elliptical, polygonal, or the like.

When the shape of the main surface of the thermal conduction sheet is polygonal, preferably square such as rectangular, the length of one side may be from 3 mm to 100 mm, or from 5 mm to 80 mm.

When the shape of the main surface of the thermal conduction sheet is rectangular, it is preferable that the plurality of thermal conduction sheets are disposed so that two sides facing each other in the main surface are along the longitudinal direction of the carrier film. At this time, the ratio (width direction length/longitudinal direction length) of the length (longitudinal direction length) of two sides along the longitudinal direction of the carrier film and the length (width direction length) of two sides along the width direction perpendicular to the longitudinal direction of the carrier film may be from 0.1 to 5, may be from 0.2 to 4, or may be from 0.3 to 3.

Regarding the plurality of thermal conduction sheets disposed at intervals in the longitudinal direction of the carrier film and the cover film, the shortest distance between adjacent thermal conduction sheets may be 2 mm or more, may be from 2 mm to 100 mm, may be from 5 mm to 60 mm, or may be from 5 mm to 30 mm. In a case in which the shortest distance between adjacent thermal conduction sheets is 2 mm or more, when the thermal conduction sheet is pressure bonded to an adherend such as a heat generator or heat dissipator, it is possible to prevent another thermal conduction sheet adjacent to the thermal conduction sheet as a target to be pressure bonded from interfering with the pressure bonding to the adherend. As a result, it tends to be possible to prevent damage to another heat conductive sheet, unintended adhesion of another heat conductive sheet to the adherend, or the like. In a case in which the shortest distance between adjacent thermal conduction sheets is 100 mm or less, productivity tends to be excellent when the thermal conduction sheet is pressure bonded to the adherend such as the heat generator or heat dissipator.

The thermal conduction sheet holder of the present disclosure may include a plurality of release layers disposed along the longitudinal direction of the carrier film between the carrier film and the plurality of thermal conduction sheets, or one or more thermal conduction sheets may be disposed on each of the plurality of release layers. Two or more thermal conduction sheets may be disposed or two to fifty thermal conduction sheets may be disposed on each of the plurality of release layers. When the plurality of release layers is disposed, it tends to be possible to prevent a deflection of the release layer and the misalignment of the thermal conduction sheet due to the deflection.

Further, when the thermal conduction sheet holder is disposed so that the cover film is at a lower side in a vertical direction and the carrier film is at an upper side in the vertical direction, it is preferable that the shape of a gap formed by the adjacent release layers, and the adjacent thermal conduction sheets respectively disposed on the adjacent release layers, is convex when viewed from the width direction of the thermal conduction sheet holder. Thereby, since the thermal conduction sheet is not disposed on both ends in the longitudinal direction on the surfaces of the plurality of release layers where the thermal conduction sheets are disposed, the carrier film tends to be easily peeled from the thermal conduction sheet.

In a case in which the shape of the aforementioned gap is convex when viewed from the width direction of the thermal conduction sheet holder, the ratio (side in vertical lower side of convex/side in vertical upper side of convex) of a side in the vertical upper side of convex, which is the shortest distance between adjacent release layers and a side in the vertical lower side of convex, which is the shortest distance between adjacent thermal conduction sheets may be more than 1 and 300 or less, may be from 1.2 to 50, or may be from 1.5 to 10.

In a case in which the shape of the aforementioned gap is convex when viewed from the width direction of the thermal conduction sheet holder, the ratio (side in vertical upper side of convex/height of convex) of the height of the convex and a side in the vertical upper side of convex, which is the shortest distance between adjacent release layers may be from 0.1 to 1000, may be from 0.5 to 100, or may be from 1 to 50.

It is preferable that the width direction length of the carrier film and the width direction length of the cover film is larger than the width direction length of the thermal conduction sheet. When the width direction length of the carrier film is larger than the width direction length of the thermal conduction sheet, the carrier film can be easily transported and the carrier film can be easily peeled from the thermal conduction sheet. Further, when the width direction length of the cover film is larger than the width direction length of the thermal conduction sheet, the thermal conduction sheet can be suitably protected, and the cover film can be easily peeled from the thermal conduction sheet.

The ratio (width direction length of carrier film/width direction length of thermal conduction sheet) of the width direction length of the carrier film with respect to the width direction length of the thermal conduction sheet is preferably more than 1 and 15 or less, more preferably from 1.05 to 10, and still more preferably from 1.1 to 5.

The ratio (width direction length of cover film/width direction length of thermal conduction sheet) of the width direction length of the cover film with respect to the width direction length of the thermal conduction sheet is preferably more than 1 and 15 or less, more preferably from 1.05 to 10, and still more preferably from 1.1 to 5.

In the thermal conduction sheet holder of the present disclosure, it is preferable that the thermal conduction sheet is not disposed on both ends in the width direction of the carrier film from the viewpoint of transportability, and it is more preferable that a plurality of sprocket holes for transporting the carrier film are disposed at a regular interval along the longitudinal direction on both ends of the carrier film. Further, when the plurality of sprocket holes are disposed at regular intervals, it is easier to dispose the plurality of thermal conduction sheets at a regular interval in the longitudinal direction of the carrier film based on the interval between the sprocket holes, and it also facilitates positioning when pressure bonding the thermal conduction sheet to one of the heat generator or heat dissipator.

The distance between centers of adjacent sprocket holes may be from 2 mm to 10 mm, or may be from 3 mm to 6 mm.

The equivalent circle diameter of the sprocket hole may be from 0.5 mm to 5 mm, or may be from 1 mm to 3 mm.

In the thermal conduction sheet used in the present disclosure, from the viewpoint that the thermal conduction sheet is likely to crush under the high-temperature press conditions in the second pressure bonding step, and likely to adhere to the other of the heat generator or the heat dissipator, the compressive elastic modulus when the compressive stress at 150° C. is 0.1 MPa is preferably 1.4 MPa or less, more preferably 1.3 MPa or less, and still more preferably 1.2 MPa or less. The lower limit of the compressive elastic modulus when the compressive stress at 150° C. is 0.1 MPa is not particularly limited. The compressive elastic modulus may be 0.5 MPa or more, or 0.7 MPa or more.

The compressive elastic modulus of the thermal conduction sheet can be measured using a compression tester (for example, INSTRON 5948 Micro Tester (INSTRON)). A load in the thickness direction is applied to the thermal conduction sheet and the displacement (mm) and load (N) are measured. The strain (dimensionless) determined by displacement (mm)/thickness (mm) is shown on the horizontal axis, the stress (MPa) determined by load (N)/area ($mm^2$) is shown on the vertical axis, and the slope at the time of predetermined stress is taken as the compressive elastic modulus (MPa). Specifically, it can be measured, for example, by the method described in Examples.

In the thermal conduction sheet used in the present disclosure, the tack strength at 25° C. is preferably 5.0 N·mm or more, more preferably 6.0 N·mm or more, and still more preferably 7.0 N·mm or more. In a case in which the tack strength is 5.0 N·mm or more, it is possible to prevent peeling of the thermal conduction sheet from the heat generator and heat dissipator when the heat dissipating device provided with the thermal conduction sheet warps and the interval between the heat generator and heat dissipator increases. The upper limit of the tack strength is not particularly limited. The tack strength may be 20.0 N·mm or less, or may be 15.0 N·mm or less.

The tack strength of the thermal conduction sheet at 25° C. can be measured using a universal physical property tester (for example, Texture Analyzer (Eiko Seiki Co., Ltd.)). At 25° C. (room temperature), a probe with a diameter of 7 mm is pressed to a thermal conduction sheet with a load of 40 N and held for 10 seconds and then the area obtained by integrating the load-displacement curve when the probe is pulled up is taken as the tack strength (N·mm) at 25° C.

In the thermal conduction sheet used in the present disclosure, the compressive elastic modulus when the compressive stress at 150° C. is 0.1 MPa and the tack strength at 25° C. preferably satisfy the aforementioned conditions.

As described above, the thermal conduction sheet with the compressive elastic modulus when the compressive stress at 150° C. is 0.1 MPa of 1.4 MPa or less is a soft sheet, and the thermal conduction sheet with the tack strength at 25° C. is 5.0 N·mm or more is a highly adhesive sheet. Therefore, when trying to pick up such a soft or highly adhesive thermal conduction sheet and mount it on the heat generator, heat dissipator, or the like, there is a problem that the soft or highly adhesive thermal conduction sheet is likely to deform or break, and thus the soft or highly adhesive thermal conduction sheet cannot be easily peeled from a base material such as a protective sheet, or that the thermal conduction sheet is deformed or broken after peeling, and thus cannot be used for implementation to the heat generator, heat dissipator, or the like.

On the other hand, the thermal conduction sheet holder of the present disclosure does not require the aforementioned pick-up when mounting the thermal conduction sheet on the heat generator, heat dissipator, or the like, can prevent deformation, breakage or the like of the thermal conduction sheet and the thermal conduction sheets can be continuously mounted on the generator, heat dissipator, or the like. Thus, the handling of the thermal conduction sheet and the manufacturing efficiency of the heat dissipating device are excellent.

The compressive elastic modulus and tack strength can be obtained, for example, by adjusting the mixing ratio of each component used in the thermal conduction sheet.

Hereinafter, a preferred composition of the thermal conduction sheet will be explained.

<<Thermal Conductive Filler>>

The thermal conduction sheet preferably contains a thermal conductive filler. The thermal conductive filler is not particularly limited as long as it is a filler having thermal conductivity. Examples of the thermal conductive filler include particles of high thermal conductivity metals such as silver, copper and aluminum, particles of ceramics such as alumina, aluminum nitride, boron nitride and magnesium oxide, and graphite particles. As the thermal conductive filler, one type may be used alone, or two or more types may be used in combination.

Especially, as the thermal conductive filler, graphite particles are preferable since they have low thermal resistance and excellent thermal conductivity, and at least one kind of graphite particles selected from the group consisting of flake-shaped particles, ellipsoidal particles, and rod-shaped particles, which will be described later, is more preferable.

The mass-average particle size (D50) of the graphite particles is measured using a laser diffraction-type particle size distribution analyzer that utilizes a laser diffraction-scattering method (e.g., "MICROTRAC Series MT3300" manufactured by Nikkiso Co., Ltd.), and corresponds to a particle size at which the cumulative weight reaches 50% on a weight-cumulative particle size distribution curve drawn from the side of smaller particle sizes.

The particle size distribution of the thermal conductive filler is not particularly limited, and the particle size distribution, where the horizontal axis is the particle size and the vertical axis is the frequency, may be a monodisperse system having a single peak or the particle size distribution may be a polydisperse system having a plurality of peaks. Further, the particle size distribution may be narrow or the particle size distribution may be broad.

The content of the thermal conductive filler in the thermal conduction sheet is, for example, preferably from 15% by volume to 50% by volume, more preferably from 20% by volume to 45% by volume, and still more preferably from 25% by volume to 40% by volume from the point of balance of the thermal conductivity and adhesiveness with the heat generator, heat dissipator, or the like.

When the content of the thermal conductive filler is 15% by volume or more, the thermal conductivity tends to be further improved. When the content of the thermal conductive filler is 50% by volume or less, the decrease in stickiness, and adhesiveness with heat generators, heat dissipators, or the like tends to be efficiency prevented.

The content (% by volume) of the thermal conductive filler is a value determined by the following Formula.

Content (% by volume) of thermal conductive filler= $[(Aw/Ad)/\{(Aw/Ad)+(Bw/Bd)+(Cw/Cd)\}]\times 100$ $Aw$: Mass composition of thermal conductive filler (% by mass)
$Bw$: Mass composition of resin (% by mass)
$Cw$: Mass composition of the other optional components (% by mass)
$Ad$: Density of thermal conductive filler
$Bd$: Density of resin
$Cd$: Density of the other optional components The thermal conductive filler may contain at least one kind of graphite particles selected from the group consisting of flake-shaped particles, ellipsoidal particles, and rod-shaped particles. In addition, when the graphite particles are flake-shaped particles, a planar direction may be oriented in a thickness direction, when the graphite particles are ellipsoidal particles, a major axis direction may be oriented in the thickness direction, or when the graphite particles are rod-like particles, a longitudinal direction may be oriented in the thickness direction.

With such a configuration, the thermally conductive sheet has low thermal resistance and excellent thermal conductivity.

The graphite particles preferably has a flake-shape. By selecting flake-shaped particles, the thermal conductivity tends to be further improved. This may be because, for example, the flake-shaped particles are more easily oriented in a specific direction in the thermal conduction sheet. A "six-membered ring plane" means a plain in which a six-membered ring is formed in a hexagonal system, and means a (0001) crystal plane.

Whether or not the six-membered ring planes in a crystal of the graphite particles are oriented in the planar direction of flake-shaped particles, the major axis direction of ellipsoidal particles, or the longitudinal direction of rod-shaped particles, can be analyzed by an X-ray diffraction analysis. Specifically, the orientation direction of the six-membered ring planes in a crystal of the graphite particles is verified by the following method.

First, a measurement sample sheet, in which the planar direction of flake-shaped particles, the major axis direction of ellipsoidal particles, or the longitudinal direction of rod-shaped particles of graphite particles is oriented along the planar direction of the sheet, is prepared. Specific examples of the method of preparing the measurement sample sheet include the following method.

A sheet is prepared from a mixture containing a resin and graphite particles, the amount of the graphite particles being 10% by volume or more with respect to the resin. The "resin" used herein may be any material which does not cause a peak that would hinder X-ray diffraction and which is capable of forming a sheet. Specific examples that can be used include an amorphous resin with cohesion used as a binder, such as an acrylic rubber, an acrylonitrile-butadiene rubber (NBR) or a styrene-isobutylene-styrene copolymer (SIBS).

The sheet obtained from the mixture is pressed to a thickness of one-tenth or less of the original thickness. Plural of these pressed sheets are layered to form a laminate. The laminate is further compressed to a thickness of one tenth or less, and the above processes are repeated at least three times to obtain a measurement sample sheet. By the above processes, the graphite particles in the obtained measurement sample sheet become oriented so that the planar direction in the case of flake-shaped particles, the major axis direction in the case of ellipsoidal particles, or the longitudinal direction in the case of rod-shaped particles, is oriented along the planar direction of the measurement sample sheet.

The surface of the measurement sample sheet prepared in the above-described manner is subjected to an X-ray diffraction analysis. The height H1 of a peak that appears in the vicinity of 2θ=77°, which corresponds to the (110) plane of graphite, and the height H2 of a peak that appears in the vicinity of 2θ=27°, which corresponds to the (002) plane of graphite, are measured. In the measurement sample sheet prepared in the above-described manner, the value obtained by dividing H1 by H2 is from 0 to 0.02.

Accordingly, the phrase "the six-membered ring planes in a crystal of the graphite particles is oriented in the planar direction in a case of flake-shaped particles, the major axis direction in a case of ellipsoidal particles, or the longitudinal direction in a case of rod-shaped particles" refers to a state in which, when an X-ray diffraction analysis is performed on a surface of a sheet containing the graphite particles, a value obtained by dividing the height of a peak that appears in the vicinity of 2θ=77°, which corresponds to the (110) plane of the graphite particles, by the height of a peak that appears in the vicinity of 2θ=27°, which corresponds to the (002) plane of the graphite particles, is from 0 to 0.02.

The conditions of the X-ray diffraction analysis in the present disclosure are as follows.

Apparatus: for example, "D8 DISCOVER" manufactured by Bruker AXS GmbH
X-ray source: CuKα having a wavelength of 1.5406 nm, 40 kV, 40 mA
Step (measurement step size): 0.01°
Step time: 720 sec.

The description "when the graphite particles are flake-shaped particles, a planar direction of the graphite particles is oriented in a thickness direction of the thermal conduction sheet, when the graphite particles are ellipsoidal particles, a major axis direction of the graphite particles is oriented in the thickness direction of the thermal conduction sheet, when the graphite particles are rod-like particles, a longitudinal direction of the graphite particles is oriented in the thickness direction of the thermal conduction sheet" means that an angle formed by the surface (main face) of the thermal conduction sheet and the planar direction in the case of flake-shaped particles, the major axis direction in the case of ellipsoidal particles, or the longitudinal direction in the case of rod-shaped particles (this angle is hereinafter also referred to as "orientation angle"), is 60° or more. The orientation angle is preferably 80° or more, more preferably 85° or more, and still more preferably 88° or more.

The orientation angle is determined by observing a cross-section of the thermal conduction sheet under a scanning electron microscope (SEM), measuring the angle (orientation angle) that is formed by the surface (main face) of the thermal conduction sheet and the planar direction in the case of flake-shaped particles, the major axis direction in the case of ellipsoidal particles, or the longitudinal direction in the case of rod-shaped particles, for random 50 graphite particles, and taking the average of the measured values.

The particle size of the graphite particles is not particularly limited. The average particle size of the graphite particles is preferably from one-half of the average thickness of the thermal conduction sheet to equal to the average thickness of the thermal conduction sheet. When the average particle size of the graphite particles is one-half of the average thickness of the thermal conduction sheet or more, efficient thermal conduction paths are formed in the thermal conduction sheet, whereby the thermal conductivity tends to be improved. When the average particle size of the graphite particles is equal to or less than the average thickness of the thermal conduction sheet, protrusions of the graphite particles can be reduced, whereby favorable adhesiveness at the surface of the thermal conduction sheet tends to be achieved.

When a layer-slice method as described in JP-A No. 2008-280496 is employed, the particle size of the graphite particles used as a raw material is, in terms of mass-average particle size, preferably one-half of the average thickness of the resulting thermal conduction sheet or more, and may be larger than the average thickness of the thermal conduction sheet. The particle size of the graphite particles used as a raw material may be larger than the average thickness of the resulting thermal conduction sheet because, for example, the thermal conduction sheet is produced by slicing a laminate together with the graphite particles and consequently the graphite particles do not protrude from the surface of the resulting thermal conduction sheet even when the graphite particles having a particle size of larger than the average thickness of the resulting thermal conduction sheet are contained. Further, when the graphite particles are sliced together as described above, a large number of graphite particles penetrating through the resulting thermal conduction sheet in the thickness direction are generated, whereby extremely efficient thermal conduction paths are formed, and the thermal conductivity tends to be further improved.

When the layer-slice method is employed, the particle size of the graphite particles used as a raw material is, in terms of mass-average particle size, more preferably from 1-fold to 5-fold of the average thickness of the resulting thermal conduction sheet. When the mass-average particle size of the graphite particles is 1-fold or more of the average thickness of the resulting thermal conduction sheet, more efficient thermal conduction paths are formed, whereby the thermal conductivity is further improved. When the mass-average particle size of the graphite particles is 5-fold or less of the average thickness of the resulting thermal conduction sheet, the area occupied by the graphite particles at the surface of the thermal conduction sheet does not become excessively large, whereby deterioration of the adhesiveness can be prevented.

A content of the graphite particles in the thermal conductive filler is, for example, preferably from 50% by volume to 100% by volume, more preferably from 80% by volume to 100% by volume, still more preferably from 95% by volume to 100% by volume and particularly preferably 100% by volume with respect to a total volume of the thermal conductive filler.

The thermal conduction sheet may also contain particles other than flake-shaped particles, ellipsoidal particles, or rod-shaped particles as the graphite particles, and may include spherical graphite particles, artificial graphite particles, exfoliated graphite particles, acid-treated graphite particles, expandable graphite particles, carbon fiber flakes or the like.

The graphite particles are preferably flake-shaped particles and, from the viewpoint of ease of obtaining flake-shaped particles having a high degree of crystallization and large particle sizes, flake-shaped expandable graphite particles obtained by pulverizing a sheet-formed expandable graphite are preferred.

<<Resin>>

The thermal conduction sheet preferably contains a resin. Since the thermal conduction sheet contains a resin, the thermal conduction sheet tends to have excellent flexibility and good adhesiveness to the heat generator, heat dissipator or the like.

The resin is not particularly limited, and for example, may be a curable resin or may be a non-curable resin. Examples of the resin include an epoxy resin, silicone, an acrylic resin, a polyimide resin, a bismaleimide resin, a benzocyclobutene resin, a phenol resin, an unsaturated polyester, a diallyl phthalate resin, a polyurethane, polyimide silicone, a thermosetting polyphenylene ether, a thermosetting modified polyphenylene ether, a polybutene, a polyisoprene, a polysulfide, an acrylonitrile rubber, a silicone rubber, a hydrocarbon resin, a terpene resin, a terpene phenol resin, a hydrogenated terpene phenol and the like. As the resin, one type may be used alone, or two or more types may be used in combination.

It is preferable to select the amount of the resin in the thermal conduction sheet according to the type of the resin and desired flexibility, adhesive strength, adhesiveness, sheet strength, hydrolysis resistance, or the like. For example, the content of the resin with respect to the total volume of the thermal conduction sheet is preferably from 25% by volume to 75% by volume, more preferably from 40% by volume to 70% by volume, and still more preferably from 50% by volume to 65% by volume.

<<Other Component>>

The thermal conduction sheet may contain component(s) other than the thermal conductive filler, or the resin, in accordance with the intended purpose. For example, the thermal conduction sheet may contain a flame retardant for the purpose of imparting flame retardancy.

The flame retardant is not particularly limited, and may be selected as appropriate from commonly used flame retardants. Examples of the flame retardant include a red phosphorus-based flame retardant and a phosphate-based flame retardant. In particular, a phosphate-based flame retardant is preferable from the viewpoints of excellent safety and improved adhesiveness due to the plasticization effect.

Examples of the red phosphorus-based flame retardant that may be used include a pure red phosphorus particles as well as those having various coatings for the purpose of improving safety or stability, and those produced as a masterbatch. Specific examples include Nova Red, Nova Excel, Nova Quel, and Nova Pellet (all of them are trade names) manufactured by Rin Kagaku Kogyo Co., Ltd.

Examples of the phosphate-based flame retardant include: an aliphatic phosphate such as trimethyl phosphate, triethyl phosphate, or tributyl phosphate; an aromatic phosphate such as triphenyl phosphate, tricresyl phosphate, cresyl diphenyl phosphate, trixylenyl phosphate, cresyl-di-2,6-xylenyl phosphate, tris(t-butylphenyl) phosphate, tris(isopropylated phenyl) phosphate, or isopropylated triaryl phosphate; and an aromatic condensed phosphate such as resorcinol bis-diphenyl phosphate, bisphenol A-bis(diphenyl phosphate), or resorcinol bis-dixylenyl phosphate.

In particular, bisphenol A-bis(diphenyl phosphate) is preferrable, since it has excellent hydrolysis resistance and exerts an excellent effect of improving adhesiveness by its plasticization effect.

The content of the flame retardant in the thermal conduction sheet is not limited, and the flame retardant may be used in an amount that can exert its flame retardancy. The content of the flame retardant is preferably 40% by volume or less and, from the viewpoint of preventing the deterioration of thermal resistance due to bleeding of the component(s) of the flame retardant to the surface of the thermal conduction sheet, the content of the flame retardant is preferably 30% by volume or less.

The thermal conduction sheet may contain an additive such as an antioxidant, a radical trapping agent, or a pH adjuster, if necessary, and preferably contain an antioxidant. The content of the additive(s) in the thermal conduction sheet is preferably 5% by volume or less, more preferably 3% by volume or less, and still more preferably 1% by volume or less.

[Method of Manufacturing Thermal Conduction Sheet Holder]

Examples of a method of manufacturing the thermal conduction sheet holder include the following method. The method of manufacturing it includes a step of preparing a composition that includes a thermal conductive filler, a resin and optional other component(s) (also referred to as a "preparation step"); a step of obtaining sheet by forming a sheet from the composition (also referred to as a "sheet preparation step"); a step of producing a laminate by any one of layering a plurality of the obtained sheets, folding one of the obtained sheet, or winding one of the obtained sheet (also referred to as a "laminate preparation step"); a step of slicing off a side face of the laminate (slicing step); and a step of sandwiching a plurality of sliced thermal conduction sheets between a cover film and a carrier film and laminating the plurality of thermal conduction sheets (lamination step).

By producing a thermal conduction sheet using the above-described method, efficient thermal conduction paths are likely to be formed, and consequently, a thermal conduction sheet having a high thermal conductivity and excellent adhesiveness tends to be obtained.

<Preparation Step>

The method of preparing the composition that constitutes the thermal conduction sheet is not particularly limited, and any method may be employed as long as the thermal conductive filler, the resin and optional other component(s) can be uniformly mixed. A commercially available composition may also be used. With regard to the details of the preparation of the composition, reference can be made to paragraph [0033] of JP-A No. 2008-280496.

<Sheet Preparation Step>

The sheet preparation step is not particularly limited, and may be performed by any method as long as a sheet can be formed from the composition obtained in the previous step. The sheet production step is preferably performed by, for example, at least one molding method selected from the group consisting of rolling, pressing, extrusion, and coating. With regard to the details of the sheet preparation step, reference can be made to paragraph [0034] of JP-A No. 2008-280496.

<Laminate Preparation Step>

In the laminate preparation step, a laminate of a sheet obtained in the previous step is formed. The laminate may be prepared by, for example, sequentially layering multiple separate sheets, may be prepared by folding a single sheet, or may be prepared by winding a single sheet. With regard to the details of the laminate preparation step, reference can be made to paragraphs [0035] to [0037] of JP-A No. 2008-280496.

<Slicing Step>

The slicing step is not particularly restricted, and may be performed by any method as long as a side face of the laminate can be sliced off. From the viewpoint of forming extremely efficient thermal conduction paths by the graphite particles penetrating through the thermal conduction sheet in the thickness direction thereby further improving the thermal conductivity, it is preferable that the side face of the laminate is sliced off in a thickness of twice or less the mass-average particle size of the graphite particles. With regard to the details of the slicing step, reference can be made to paragraph [0038] of JP-A No. 2008-280496.

<Lamination Step>

The lamination step is not particularly limited, and may be performed by any method as long as the plurality of sliced thermal conduction sheets are sandwiched between a cover film and carrier film or between a cover film and release film, and the plurality of thermal conduction sheets are attached to the cover film and the carrier film or release film. For example, it may be that after cutting the sliced thermal conduction sheets to a predetermined size, the plurality of thermal conduction sheets are disposed on the cover film, carrier film or release film, and then the plurality of disposed thermal conduction sheets are sandwiched between the cover film and carrier film or between the cover film and release film, and the thermal conduction sheets are attached to these to obtain a thermal conduction sheet holder. In addition to the above method, for example, it may be that the sliced thermal conduction sheets are disposed on the cover film, carrier film, or release film, and the thermal conduction sheets are cut to a predetermined size by punching or the like, and then the plurality of cut thermal conduction sheets may be sandwiched between the cover film and carrier film or between the cover film and release film, and the thermal conduction sheets are attached to these to obtain a thermal conduction sheet holder.

For example, it is also possible that, in the lamination step, the elongated thermal conduction sheet is disposed on the cover film, carrier film, or release film, and then the elongated thermal conduction sheet is cut by dicing processing, laser processing or the like, to dispose the plurality of thermal conduction sheets on the cover film, carrier film or release film. However, in a case in which the elongated thermal conduction sheet is cut by dicing processing, laser processing, or the like, the cover film, carrier film, or release film on which the elongated thermal conduction sheet is disposed will also be partially cut in the thickness direction and therefore a notch will occur. If a notch occurs on these films, there is a risk that these films will break or deform when a tensile stress or the like is applied to the obtained thermal conduction sheet holder. As a result, it is likely to occur the problem that the thermal conduction sheets cannot be continuously pressure bonded to the adherend using the thermal conduction sheet holder or the problem, in the thermal conduction sheet holder, the relative positions between the plurality of thermal conduction sheets are misaligned and the thermal conduction sheets cannot be pressure bonded to the adherend with high accuracy. Such a problem is likely to occur particularly in a case in which a notch is generated on the cover film or carrier film, and further a continuous process by the method shown in FIG. 3, which will be described later, becomes difficult in a case in which a notch is generated on the carrier film.

From the above points, it is preferable that the lamination step include disposing the plurality of thermal conduction sheets on the cover film, carrier film or release film, or cutting thermal conduction sheet, which is disposed on the cover film, carrier film or release film, by punching or the like. Thereby, a notch on the cover film, carrier film, or release film do not occur or is reduced, and it is possible to suitably prevent breakage, deformation of film or the like when tensile stress or the like is applied to the thermal conduction sheet holder. Furthermore, unlike cutting the elongated thermal conduction sheet by dicing processing, laser processing, or the like, it is easy to dispose the plurality of thermal conduction sheets so that the shortest distance between adjacent thermal conduction sheets is 2 mm or more.

<Method of Manufacturing Heat Dissipating Device>

A method of manufacturing a heat dissipating device of the present disclosure is a method of manufacturing the heat dissipating device obtained by using the thermal conduction sheet holder of the present disclosure, and interposing the thermal conduction sheet between a heat generator and a heat dissipator, and the method includes a step of peeling the cover film from the thermal conduction sheet holder; a step of pressure bonding the thermal conduction sheet to one of the heat generator or the heat dissipator in the thermal conduction sheet holder from which the cover film is peeled; a step of peeling the carrier film from the thermal conduction sheet to which the one of the heat generator or the heat dissipator is adhered; and a step of pressure bonding the other of the heat generator or the heat dissipator to an opposite side of the thermal conduction sheet from the side at which the one of the heat generator or the heat dissipator is bonded.

The heat dissipating device obtained by the manufacturing method of the present disclosure can efficiently conduct heat from the heat generator to the heat dissipator by laminating the heat generator and heat dissipator via the thermal conduction sheet. Further, the thermal conduction sheet can be easily removed when removing the heat dissipator from the heat generator.

The manufacturing method of the present disclosure includes a step of peeling the cover film from the thermal conduction sheet holder. For example, in a case in which the thermal conduction sheet holder of the present disclosure is configured to be taken up in a roll shape, the cover film may be peeled while the thermal conduction sheet holder is fed out with the thermal conduction sheet holder with a roll shape attached to a rotatable feeding roll.

The manufacturing method of the present disclosure include a step of pressure bonding the thermal conduction sheet to one of the heat generator or the heat dissipator in the thermal conduction sheet holder from which the cover film is peeled (hereinafter also referred to as "first pressure bonding step"). At this time, the processing may be performed that, in a continuous roll-to-roll process, the thermal conduction sheet holder from which the cover film is peeled is transported, and the thermal conduction sheet disposed on the thermal conduction sheet holder is pressure bonded to one of the heat generator or heat dissipator.

Examples of the heat generator include a semiconductor package with a semiconductor chip(s) disposed on a substrate, a display, an LED, an electric lamp, an automotive power module, and an industrial power module. Examples of the heat dissipator include: a heat sink that utilizes a fin, a plate or the like made of aluminum or copper; an aluminum or copper block connected to a heat pipe; an aluminum or copper block in which a cooling liquid is circulated using a pump; a Peltier element; and an aluminum or copper block that includes a Peltier element.

The pressure and heating temperature in the first pressure bonding step are not particularly limited as long as the thermal conduction sheet can be adhered to one of the heat generator or heat dissipator. For example, the aforementioned pressure may be from 0.1 MPa and 4.0 MPa, or may be from 0.15 MPa and 2.0 MPa. Further, the aforementioned heating temperature may be from 15° C. to 100° C., or may be from 20° C. to 35° C. When pressure bonding the thermal conduction sheet to the heat generator, the heat generator may be heated for pressure bonding.

The manufacturing method of the present disclosure includes a step of peeling the carrier film from the thermal conduction sheet to which the one of the heat generator or the heat dissipator is adhered. For example, after pressure bonding the thermal conduction sheet to one of the heat generator or the heat dissipator in the aforementioned pressure bonding step, it may be that the pressure is released and the carrier film is peeled from the thermal conduction sheet. By this step, it is possible to obtain the one of the heat generator or the heat dissipator to which the thermal conduction sheet is adhered. Further, a release layer may be provided between the carrier film and the thermal conduction sheet, and in this case, the carrier film may be peeled from the thermal conduction sheet via the release layer.

In a continuous roll-to-roll process, the carrier film from which the thermal conduction sheet has been peeled is attached to a rotatable take-up roll on the upstream side in the transport direction, and while recovering the carrier film from which the thermal conduction sheet has been peeled by rotating the take-up roll and the above-mentioned feeding roll, a new thermal conduction sheet is transported and the treatment of pressure bonding it to one of the new heat generator or heat dissipator may be performed continuously.

The manufacturing method of the present disclosure include a step of pressure bonding the other of the heat generator or the heat dissipator to an opposite side of the thermal conduction sheet from the side at which the one of the heat generator or the heat dissipator is bonded (hereinafter also referred to as "second pressure bonding step"). It is possible to obtain heat dissipating device in which the thermal conduction sheet(s) is interposed between the heat generator and heat dissipator by pressure bonding the other of the heat generator or the heat dissipator to one of the heat generator or the heat dissipator to which the thermal conduction sheet is adhered. The preferable conditions of the pressure and heating temperature in the second pressure bonding step is not particularly limited as long as the thermal conduction sheet can be adhered to the other of the heat generator or the heat dissipator. For example, the aforementioned pressure may be from 0.1 MPa and 2.0 MPa, or may be from 0.15 MPa and 1.0 MPa. Further, the aforementioned heating temperature may be from 80° C. to 180° C., or may be from 100° C. to 170° C. When pressure bonding the thermal conduction sheet one of the main surface of which is exposed, to the heat generator, the heat generator may be heated for pressure bonding.

In the manufacturing method of the present disclosure, the pressure bonding conditions in the first pressure bonding step and the second pressure bonding step may be adjusted so that the ratio (compression ratio) of the thickness of the thermal conduction sheet that is reduced after the second pressure bonding step to the initial thickness of the thermal conduction sheet before the first pressure bonding step is from 5% to 35%.

(One Example of Thermal Conduction Sheet Holder)

Figure 2:
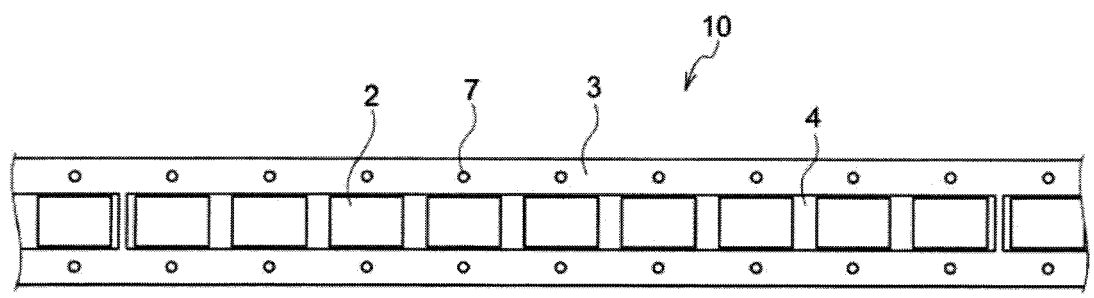
FIG. 2 is a view of the area a corresponding to the dotted line in FIG. 1 when viewed from a side of a cover film 1.

One example of the thermal conduction sheet holder will be described below with reference to FIG. 1 and FIG. 2. FIG. 1 is a side view of an example of a thermal conduction sheet holder of the present disclosure. FIG. 2 is a view of the area a corresponding to the dotted line in FIG. 1 when viewed from a side of a cover film 1. In FIG. 2, the cover film 1 is omitted. As shown in FIG. 1, a thermal conduction sheet holder 10 includes, in the following order, an elongated carrier film 3, a plurality of thermal conduction sheets 2, and an elongated cover film 1. Further, the thermal conduction sheet holder 10 includes, in the following order, release films 4 and an adhesive layer 5, disposed between the carrier film 3 and the thermal conduction sheets 2 when viewed from a side of the cover film 1. The plurality of release films 4 is disposed along a longitudinal direction of the carrier film 3, and nine thermal conduction sheets are disposed on each of the plurality of release films. Further, the area a surrounded by the circled dotted line in FIG. 1 corresponds to a gap formed by the adjacent release films 4, and the adjacent thermal conduction sheets 2 respectively disposed on the adjacent release layers, and the shape of the gap is convex when viewed from the front.

The thermal conduction sheet holder 10 is configured to be taken up around the winding core 6 along a longitudinal direction in a roll shape. In FIG. 1, a portion of the thermal conduction sheet holder 10 taken up in a roll shape is pulled out. In FIG. 1, the pulled out portion of the thermal conduction sheet holder 10 is shown more emphasized than the winding core 6, and the relative size relationship between the pulled out portion and the winding core 6 is not limited to this. In FIG. 1, the thermal conduction sheet holder 10 is taken up in a roll shape so that the cover film 1 is positioned outside and the carrier film 3 is positioned inside with respect to the central axis. The present disclosure is not limited to this, and the thermal conduction sheet holder 10 may be taken up in a roll shape so that the cover film 1 is positioned inside and the carrier film 3 is positioned outside.

The width direction length of the carrier film 3 and the width direction length of the cover film 1 are configured to be larger than the width direction length of the thermal conduction sheets 2. The thermal conduction sheets 2 are not disposed on the both ends in the width direction of the carrier film 3, and a plurality of sprocket holes 7 for transporting the carrier film are disposed at a regular interval along the longitudinal direction on both ends of the carrier film 3. The sprocket holes 7 disposed at regular intervals are also used for positioning the thermal conduction sheets 2 during transport of the carrier film.

(One Example of Manufacturing Heat Dissipating Device)

Figure 3:
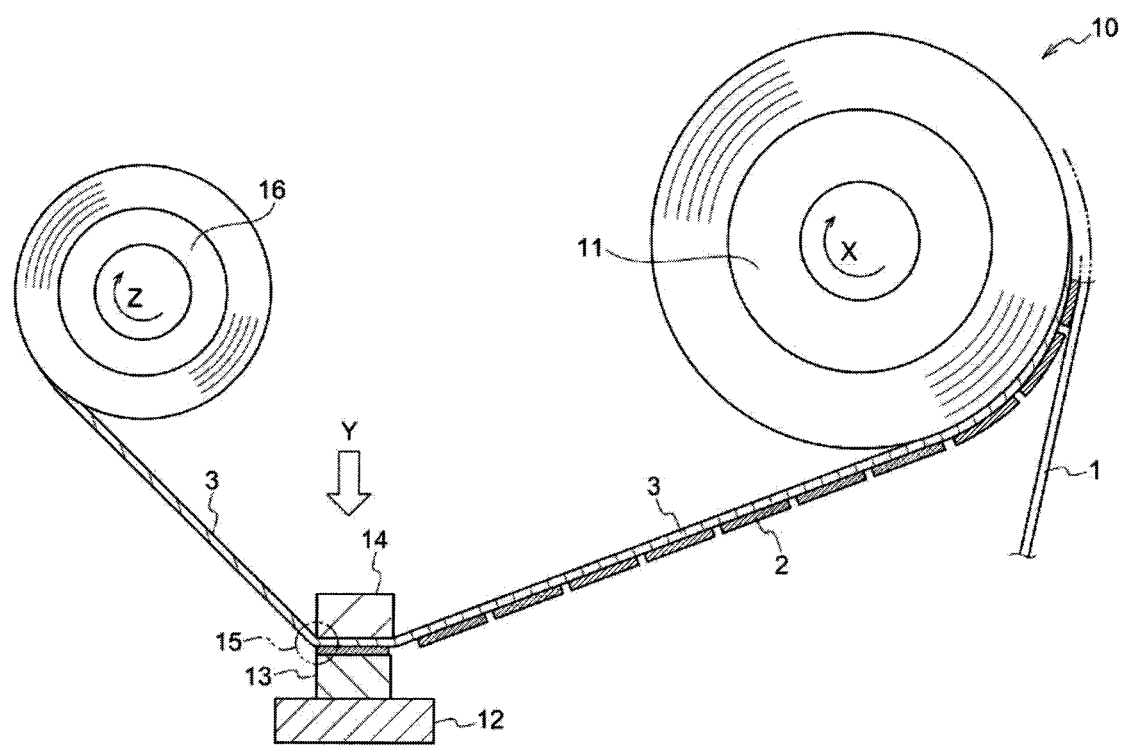
FIG. 3 is a schematic view showing a part of a manufacturing step in an example of a method of manufacturing a heat dissipating device.

One example of manufacturing the heat dissipating device will be described below with reference to FIG. 3. FIG. 3 is a schematic view showing a part of a manufacturing step in an example of a method of manufacturing a heat dissipating device. In FIG. 3, a release film 4 and an adhesive layer 5 are omitted.

As shown in FIG. 3, the thermal conduction sheet holder 10 taken up in a roll shape is attached to a feeding roll 11 that is rotatable in the direction of arrow X, and the cover film 1 is peeled from the thermal conduction sheet holder 10 pulled out from the feeding roll 11. The carrier film 3 of the thermal conduction sheet holder 10 from which the cover film 1 has been peeled is attached to a take-up roll 16 rotatable in the direction of arrow Z, which is separated from the feeding roll 11 by a regular interval. A press machine 14 is provided between the feeding roll 11 and the take-up roll 16 in the transport direction to pressure bond the thermal conduction sheet 2 to a semiconductor chip 13, which is a heat generator.

A sprocket roller (not shown) is disposed between the feeding roll 11 and the take-up roll 16, and the sprocket holes 7 are inserted into sprocket pins provided at equal intervals on the surface of the sprocket roller, and the feeding roll 11 is rotated in the direction of the arrow X and the take-up roll 16 is rotated in the direction of the arrow Z, the thermal conduction sheet 2 disposed on the carrier film 3 is transported to the area facing the press machine 14.

After thermal conduction sheet 2 disposed on the carrier film 3 is transported to the area facing press machine 14, the thermal conduction sheet 2 is pressure bonded to the semiconductor chip 13 by applying pressure in the direction of arrow Y using the press machine 14 with the thermal conduction sheet 2 disposed between the press machine 14 and the semiconductor chip 13 disposed on a substrate 12. The present disclosure is not limited to the configuration that one thermal conduction sheet 2 is pressure bonded to one semiconductor chip 13 as shown in FIG. 3, the plurality of thermal conduction sheets 2 may be pressure bonded to one semiconductor chip 13, or one thermal conduction sheet 2 or the plurality of thermal conduction sheets 2 may be pressure bonded to the plurality of semiconductor chips 13.

After the thermal conduction sheet 2 are pressure bonded, the feeding roll 11 and the take-up roll 16 are rotated to peel the carrier film 3 from the thermal conduction sheet 2 pressure bonded to the surface of the semiconductor chip 13 in the area 15. At this time, the carrier film 3 is peeled from the thermal conduction sheet 2 via a release layer (not shown), and the carrier film 3 with the release layer is recovered by the take-up roll 16, and a substrate with the semiconductor chip to which thermal conduction sheet 2 is pressure bonded, is obtained.

Then, the next thermal conduction sheet 2 transported by the carrier film 3 is pressure bonded to the surface of the semiconductor chip 13 disposed on the next substrate with the semiconductor chip, and the thermal conduction sheets 2 are able to be continuously mounted on the substrate with the semiconductor chip by repeating the aforementioned steps. As described above, the thermal conduction sheet can be efficiently pressure bonded to the heat generator.

EXAMPLE

The present invention will be specifically described below with reference to Examples, but the present invention is not limited to these Examples. Unless otherwise specified, "%" is based on mass.

Example 1

A plurality of thermal conduction sheets manufactured by Showa Denko Materials Co., Ltd. and having a thickness of 150 μm, a longitudinal direction length in a carrier film of 30 mm, and a width direction length in a carrier film of 50 mm were prepared and the thermal conduction sheets had the compressive elastic modulus when the compressive stress at 150° C. is 0.1 MPa of 1.16 MPa, the tack strength at 25° C. of 7.6N·mm, the thermal conductivity of 16 W/(m·K).

In this thermal conduction sheets, flake-shaped expandable graphite particles (Showa Denko Materials Co., Ltd. "HGF-L", mass average particle size: 270 μm, was verified that the six-membered ring planes in a crystal was oriented in the planar direction of flake-shaped particles by the aforementioned X-ray diffraction analysis) were used as the thermal conductive filler.

Furthermore, the following elongated carrier film and elongated cover film were prepared. In addition, the following adhesive layer and release film provided between the carrier film and the thermal conduction sheet were prepared.
(Carrier Film)
Elongated PET Film: Lumirror S30 (product name of Toray Industries, Inc.), thickness; 75 μm, width direction length; 66 mm
(Cover Film)
Elongated paper film: laminate of silicone release agent/polyethylene/craft paper, product name SL-70S (U2) from Sumika Kakoshi Co., Ltd., total thickness; 105 μm, width direction length; 66 mm, peel force to thermal conduction sheet; 0 mN/25 mm. Herein, the peel force of 0 mN/25 mm indicates that when the cover film is attached to a tensile tester so as to be pulled in a direction of 90° with respect to the interface with the thermal conduction sheet, they are already peeled.
(Adhesive Layer)
Acrylic resin double-sided tape: Nichiei Shinka Co., Ltd., product name Neo Fix 30, thickness; 30 μm, width direction length; 50 mm
(Release Film)
PET film treated with a release agent: Nippa Co., Ltd., product name FU, thickness; 75 μm, width direction length; 50 mm, peel force to thermal conduction sheet 18 mN/25 mm a plurality of sprocket holes with the diameter of about 2.0 mm were disposed at a regular interval along the longitudinal direction on both ends of the elongated carrier film, and the distance between centers of sprocket holes was about 5.0 mm, the shortest distance between the center of the sprocket hole and the end in the width direction was about 3.0 mm. Further, the adhesive layer and the release film were disposed in the above order between both ends of the carrier film having sprocket holes along the longitudinal direction. At this time, the release film was disposed so that the surface of the release film treated with the release agent was opposite to the adhesive layer.

Six thermal conduction sheets were disposed on each release film so that both ends in the width direction of the release film and both ends in the width direction of the thermal conduction sheet were aligned, and the release films on which six thermal conduction sheets were disposed, were disposed along the longitudinal direction. At this time, the shortest distance between adjacent thermal conduction sheets was adjusted to 20 mm.

Next, the carrier film and the cover film were disposed so that both ends of the carrier film in the width direction and both ends of the cover film in the width direction were aligned in planar view, and the plurality of thermal conduction sheets were attached to the cover film and the carrier film with the plurality of thermal conduction sheets sandwiched between the cover film and the carrier film. Thereby, an elongated thermal conduction sheet holder provided with the elongated carrier film, the adhesive layer, the release layer, the plurality of thermal conduction sheets, and the elongated cover film in the above order was manufactured. This elongated thermal conduction sheet holder was wound around the winding core along the longitudinal direction so that a side of the carrier film was positioned on a side of the winding core to obtain a thermal conduction sheet holder with a roll shape. When using the thermal conduction sheet holder with a roll shape in the roll-to-roll continuous process shown in FIG. 3, the thermal conduction sheet holder must be pulled out and attached to the winding roll before the pressure bonding step begins. In order not to generate a thermal conduction sheet that was able to be used in the pressure bonding step, there was no thermal conduction sheet between the cover film and the carrier film in the area of about 1 m in length that is first pulled out from the thermal conduction sheet holder with a roll shape.

As shown in FIG. 3, the thermal conduction sheet holder with a roll shape was attached to the feeding roll, and while the cover film was peeled from the thermal conduction sheet holder pulled out from the feeding roll, the part of the carrier film where the cover film was peeled and where the thermal conduction sheet was not provided was attached to the take-up roll, and the feeding roll and take-up roll were rotated to continuously transport the plurality of thermal conduction sheets on the carrier film. The thermal conduction sheet was pressure bonded to the surface of a semiconductor chip disposed on a substrate with the semiconductor chip under the conditions of 25° C. and 0.8 MPa using a press machine disposed between the feeding roll and the take-up roll in the transport direction of the thermal conduction sheets. After the pressure bonding, the take-up roll was rotated to peel the carrier film from the thermal conduction sheet pressure bonded to the surface of the semiconductor chip, and the substrate with the semiconductor chip to which the thermal conduction sheet was pressure bonded was recovered. Then, the next thermal conduction sheet transported by the carrier film was pressure bonded to the surface of the semiconductor chip disposed on the next substrate with the semiconductor chip, and the thermal conduction sheets were able to be continuously mounted on the substrate with the semiconductor chip by repeating the aforementioned steps. Furthermore, in this Example, when the cover film was peeled from the thermal conduction sheet via the release layer, the thermal conduction sheet was not transferred to a side of the cover film by peeling the thermal conduction sheet from a side of the carrier film, and misalignment of attachment to the semiconductor chip caused by peeling of the thermal conduction sheet from a side of the carrier film was also prevented.

Example 2

In Example 1, an elongated thermal conduction sheet holder was manufactured in the same manner as in Example 1 except that the release film was changed from product name FU by Nippa Co., Ltd. to product name X1-A3 (thickness; 75 μm, width direction length; 50 mm, peel force to thermal conduction sheet 38 mN/25 mm) by Nippa Co., Ltd.

For the thermal conduction sheet holder manufactured in Example 2, the thermal conduction sheet was pressure bonded to the substrate with the semiconductor chip in the same manner as in Example 1. When peeling the carrier film from the thermal conduction sheet pressure bonded to the surface of the semiconductor chip after pressure bonding, it was more difficult to peel the carrier film from the thermal conduction sheet than in Example 1, and the thermal conduction sheet was easily damaged.

Example 3

In Example 1, an elongated thermal conduction sheet holder was manufactured in the same manner as in Example 1 except that the release film was changed from product name FU by Nippa Co., Ltd. to product name 75E-0010 (thickness; 75 μm, width direction length; 50 mm, peel force to thermal conduction sheet 50 mN/25 mm) by FUJIMORI KOGYO CO., LTD.

For the thermal conduction sheet holder manufactured in Example 3, the thermal conduction sheet was pressure bonded to the substrate with the semiconductor chip in the same manner as in Example 1. When peeling the carrier film from the thermal conduction sheet pressure bonded to the surface of the semiconductor chip after pressure bonding, it was more difficult to peel the carrier film from the thermal conduction sheet than in Example 2, and the thermal conduction sheet was easily damaged.

Example 4

In Example 1, an elongated thermal conduction sheet holder was manufactured in the same manner as in Example 1 except that the cover film was changed from product name SL-70S (U2) by Sumika Kakoshi Co., Ltd. to product name FU (thickness; 75 width direction length; 66 mm, peel force to thermal conduction sheet 18 mN/25 mm) by Nippa Co., Ltd.

For the thermal conduction sheet holder manufactured in Example 4, the thermal conduction sheet was pressure bonded to the substrate with the semiconductor chip in the same manner as in Example 1. When peeling the cover film, a part of the thermal conduction sheet was more likely to stick to a side of the cover film than in Example 1, and the thermal conduction sheet was easily damaged.

Example 5

In Example 1, an elongated thermal conduction sheet holder was manufactured in the same manner as in Example 1 except that the cover film was changed from product name SL-70S (U2) by Sumika Kakoshi Co., Ltd. to product name SP-8LK (thickness; 88 μm, width direction length; 66 mm, peel force to thermal conduction sheet 8 mN/25 mm) by LINTEC Corporation.

For the thermal conduction sheet holder manufactured in Example 5, the thermal conduction sheet was pressure bonded to the substrate with the semiconductor chip in the same manner as in Example 1. When peeling the cover film, a part of the thermal conduction sheet was more likely to stick to a side of the cover film than in Example 1, and the thermal conduction sheet was easily damaged.

Example 6

In Example 4, an elongated thermal conduction sheet holder was manufactured in the same manner as in Example 4 except that the release film was changed from product name FU by Nippa Co., Ltd. to product name 75E-0010 (thickness; 75 μm, width direction length; 50 mm, peel force to thermal conduction sheet 50 mN/25 mm) by FUJIMORI KOGYO CO., LTD.

For the thermal conduction sheet holder manufactured in Example 6, the thermal conduction sheet was pressure bonded to the substrate with the semiconductor chip in the same manner as in Example 1. When peeling the cover film, a part of the thermal conduction sheet was more likely to stick to a side of the cover film than in Example 1, and the thermal conduction sheet was easily damaged.

The disclosure of PCT/JP2020/039140 filed on Oct. 16, 2020 is incorporated herein by reference in its entirety.

All the documents, patent applications and technical standards that are described in the present specification are hereby incorporated by reference to the same extent as if each individual document, patent application or technical standard is concretely and individually described to be incorporated by reference.

DESCRIPTION OF REFERENCE NUMERALS

1 Cover film
2 Thermal conduction sheet
3 Carrier film
4 Release film
5 Adhesive layer
6 Winding core
7 Sprocket hole
10 Thermal conduction sheet holder
11 Feeding roll
12 Substrate
13 Heat generator
14 Press machine
15 Area
16 Take-up roll

The invention claimed is:

1. A thermal conduction sheet holder, comprising, in the following order:
   an elongated carrier film;
   a plurality of release layers disposed along a longitudinal direction of the carrier film;
   a plurality of thermal conduction sheets;
   an elongated cover film covering the plurality of thermal conduction sheets, wherein:
   a shortest distance between adjacent thermal conduction sheets is 2 mm or more,
   the plurality of thermal conduction sheets are disposed at intervals in the longitudinal direction of the carrier film and the cover film, and the plurality of thermal conduction sheets are peelable from the cover film and the carrier film,
   one or more of the thermal conduction sheets are disposed on each of the plurality of release layers, and
   the plurality of thermal conduction sheets are peelable from the carrier film via the plurality of release layers.

2. The thermal conduction sheet holder according to claim 1, wherein, when the cover film is disposed at a lower side in a vertical direction and the carrier film is disposed at an upper side in the vertical direction, a shape of a gap formed by adjacent release layers, and adjacent thermal conduction sheets respectively disposed on the adjacent release layers, is convex when viewed from a width direction of the thermal conduction sheet holder.

3. The thermal conduction sheet holder according to claim 1, wherein a peel force between the carrier film and the plurality of thermal conduction sheets is larger than a peel force between the cover film and the thermal conduction sheet.

4. The thermal conduction sheet holder according to claim 1, wherein an average thickness of the plurality of thermal conduction sheets is from 50 μm to 500 μm.

5. The thermal conduction sheet holder according to claim 1, wherein the plurality of thermal conduction sheets contain a thermal conduction filler and a resin.

6. The thermal conduction sheet holder according to claim 1, which is configured to be taken up along a longitudinal direction of the thermal conduction sheet holder in a roll shape.

7. The thermal conduction sheet holder according to claim 1, wherein a width of the carrier film and a width of the cover film are larger than a width of the plurality of thermal conduction sheets in a width direction perpendicular to the longitudinal direction of the carrier film and the cover film.

8. The thermal conduction sheet holder according to claim 1, wherein a notch is not generated on a surface of the carrier film.

9. A method of manufacturing a heat dissipating device obtained by using the thermal conduction sheet holder according to claim 1, and interposing a thermal conduction sheet between a heat generator and a heat dissipator, the method comprising:
   providing the thermal conduction sheet holder according to claim 1;
   peeling the cover film from the thermal conduction sheet holder;
   pressure bonding one of the plurality of thermal conduction sheets to one of the heat generator or the heat dissipator;
   peeling the carrier film from the thermal conduction sheet to which the one of the heat generator or the heat dissipator is adhered; and
   pressure bonding the other of the heat generator or the heat dissipator to an opposite side of the thermal conduction sheet from the side at which the one of the heat generator or the heat dissipator is bonded.

* * * * *